Aug. 2, 1960
R. L. STIMSON
2,947,862
HIGH FREQUENCY CONVERTER HAVING A SERIES CATHODE SIGNAL INJECTION CIRCUIT
Filed June 3, 1959
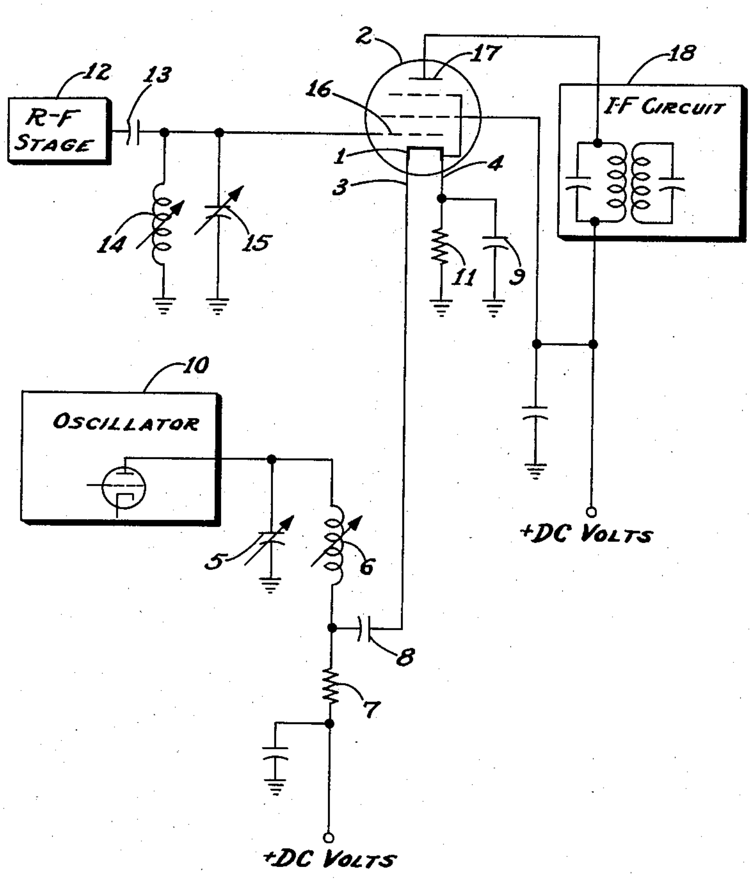
INVENTOR.
RAY L. STIMSON
BY Marvin Moody
ATTORNEY
Glenn H. Antrim
AGENT 2,947,862

HIGH FREQUENCY CONVERTER HAVING A SERIES CATHODE SIGNAL INJECTION CIRCUIT

Ray L. Stimson, Cedar Rapids, Iowa, assignor to Collins Radio Company, Cedar Rapids, Iowa, a corporation of Iowa Filed June 3, 1959, Ser. No. 817,833

3 Claims. (Cl. 250—20)

This invention pertains to high-frequency converters of superheterodyned radio receivers and particularly to converter systems that have electron tube mixers which utilize the inherent inductances of two terminal cathodes for combined tuning and coupling between local oscillator stages and mixer stages.

An object of this invention is to provide between a high-frequency local oscillator stage and a mixer stage a coupling circuit of high efficiency.

Another object is to improve the coupling between an oscillator stage and a mixer stage so that the oscillator operates reliably at relatively low-signal outputs with a minimum of interferring radiation compared with previous systems.

Another object is to increase the range of tuning of the oscillator output circuit which couples the oscillator to the mixer stage.

Still another object is to decrease coupling between the signal input circuit and the mixer.

A feature of this invention is the utilization of the cathode of the mixer stage for its inherent inductance so that it functions both as a tuning element and the coupling element between an oscillator stage and a mixer stage.

Another feature is the reduction in the number of component parts that are required in a converter system that has separate tubes for the oscillator and the mixer.

The following description and the appended claims may be more readily understood with reference to the single accompanying drawing which is a schematic diagram of a high-frequency converter.

The cathode 1 of the mixer tube 2 has separate terminals 3 and 4 which are connected to the cathode at two respective spaced apart points. The electron tube 2 may be the conventional type having two cathode terminals for use in high-frequency circuits. For example, the type 6AK5 (or ruggedized 5654) has been used satisfactorily over a range of frequencies at about 100 megacycles. In former applications the separate cathode terminals provided better bypassing of the cathode which is common to both input and output circuits so that more desirable input impedance characteristics are obtained. However, in the present application the cathode is part of the inductive element of a tuned or resonant oscillator output circuit and provides substantially the only impedance across which signal is developed for coupling the oscillator into the mixer stage.

Signal for application to the cathode 1 is developed by oscillator 10. The oscillator may be any one of the conventional types that will develop signal at the desired frequency. In one particular application the oscillator is the type using two triode tubes and having a selected crystal connected between the cathodes of the tubes. The plates of the triode tubes are connected to tuned circuits, one of which is the output circuit for connection to a mixer stage. The output circuit may be tuned either to the fundamental frequency of the oscillator or to a harmonic frequency.

In the example shown in the accompanying figure the output circuit of the oscillator comprises variable inductor 6 which is connected in series through low-impedance capacitor 8 to terminal 3 of cathode 1. The opposite terminal 4 of the cathode is connected through low-impedance capacitor 9 to ground. At high frequencies the inductor 6 is, therefore, substantially connected in series with cathode 1. The tuned circuit is completed by variable capacitor 5 which is coupled through low-impedance or bypass capacitor 9 across the series inductive circuit that comprises inductor 6 and cathode 1.

Resistor 7 that is connected to the junction of inductor 6 and capacitor 8 provides isolation resistance that offers high impedance to the oscillator signal and connects direct-current voltage through inductor 6 to the plate in the output circuit of the oscillator stage. The direct-current circuit for cathode 1 is completed from terminal 4 of the cathode to ground by resistor 11 which develops the required control grid bias for the mixer stage. The input signal that is to be mixed with the locally developed signal is derived from the radio-frequency stage 12 of the radio receiver that includes the converter system and is applied through coupling capacitor 13 to control grid 16. The control grid circuit is tuned to the incoming signal by the variable inductor 14 and variable capacitor 15 which are connected in parallel between the control grid and ground. The plate or anode 17 of mixer tube 2 is connected to a conventional intermediate-frequency circuit 18. The suppressor grid of the tube is connected to one terminal of the cathode, and the screen grid of the tube is connected in the usual manner to a source of direct-current voltage.

By utilizing the cathode as an inductor in series with the output inductor of the oscillator, the oscillator operates more efficiently than those having conventional coupling arrangements for oscillator signals of about 100 megacycles. The increased efficiency permits the supply voltages to the oscillator to be reduced so that the amplitude of the oscillator signal is decreased for minimizing undesired radiation from the oscillator to other circuits of the receiver. By connecting the cathode 1 in series with inductor 6 rather than connecting the cathode in a conventional arrangement which places a portion of inductor 6 between cathode and ground, the size of the inductor 6 is decreased. The reduction in size of the inductor decreases the distributed capacitance of the inductor. Reduction in distributed capacitance contributes to the efficiency of the oscillator by increasing the Q of its output circuit. Since the ratio of the inductance to capacitance is increased, the variable capacitor 5 is effective in tuning the output circuit over a wide frequency range.

The instant arrangement, which permits the oscillator to operate reliably for relatively low output signal, reduces the coupling between the oscillator and the input circuits so that little oscillator signal is radiated from the input circuit. An occasional circuit that is being manufactured in production quantities requires a capacitor of small capacitance connected between the terminals 3 and 4 of the cathode in order to reduce spurious oscillations to a minimum.

Although this invention has been described for a single embodiment shown in the accompanying drawing, the series cathode circuit of the converter system of this invention may be adapted to conventional circuits and still be within the spirit and scope of the following claims.

What is claimed is:

1. A converter system comprising a mixer tube having at least a cathode, a control grid, and an anode, first and second cathode terminals, a substantial portion of said cathode being connected between said first and second cathode terminals, a source of input signal connected to said control grid, an intermediate-frequency output circuit connected to said anode, means including a resonant circuit for applying injection signal to said cathode, said resonant circuit including said first and second cathode terminals for connecting said cathode in series in said resonant circuit, and one of said cathode terminals being bypassed to provide a low impedance return circuit for said injection signal and said input signal, whereby the main current flow of said resonant circuit flows through said cathode for coupling said injection signal to said mixer tube for mixing with said input signal.

2. A converter system comprising a mixer tube having at least a cathode, a control grid, and an anode, first and second cathode terminals, a substantial portion of said cathode being connected between said first and second cathode terminals, means for applying input signal between said control grid and said first cathode terminal, a local oscillator for developing injection signal to be applied to said mixer tube, the output of said oscillator including a tuning inductor, means for coupling said tuning inductor in series with said first and second cathode terminals for serially connecting said tuning inductor and said portion of said cathode, and an intermediate-frequency circuit connected to said anode.

3. A converter as claimed in claim 2 in which a tuning capacitor is connected in parallel with the series circuit that includes said tuning inductor and said cathode.

No references cited.